United States Patent [19]

van de Plassche

[11] Patent Number: 4,549,145
[45] Date of Patent: Oct. 22, 1985

[54] SWITCHING AMPLIFIER

[75] Inventor: Rudy J. van de Plassche, Sunnyvale, Calif.

[73] Assignee: U.S. Philips Corporation, New York, N.Y.

[21] Appl. No.: 537,140

[22] Filed: Sep. 29, 1983

[30] Foreign Application Priority Data

Oct. 18, 1982 [NL] Netherlands .................. 8204003

[51] Int. Cl.$^4$ .......................... H03F 1/08; H03F 3/30
[52] U.S. Cl. ....................................... 330/51; 330/273
[58] Field of Search ............. 330/51, 262, 273, 207 P, 330/298

[56] References Cited

U.S. PATENT DOCUMENTS 4,442,409  4/1984  Preslar ............................... 330/274

Primary Examiner—James B. Mullins
Assistant Examiner—G. Wan
Attorney, Agent, or Firm—Thomas A. Briody; William J. Streeter; Edward W. Goodman

[57] ABSTRACT

A switching amplifier is described which is intended in particular for sample-and-hold circuits. The switching amplifier has an output stage ($T_1$, $T_2$) of the npn-npn-type comprising two output transistors ($T_1$, $T_2$) in series. The output (4) is connected to the emitter of a first one ($T_1$) of the two output transistors ($T_1$, $T_2$) and to the collector of the second output transistor ($T_2$), a diode ($T_3$) being arranged between the output (4) and this collector. The output (4) can be switched off by switching the voltage on the base of the first transistor ($T_1$) and the voltage on the point between the diode ($T_3$) and the collector of the second transistor ($T_2$) relative to the output voltage, a third transistor ($T_4$) ensuring that in this situation the collector current of the second transistor ($T_2$) can be drained when said diode ($T_3$) is turned off, so that initially said second transistor ($T_2$) can remain conductive.

12 Claims, 6 Drawing Figures

SWITCHING AMPLIFIER

BACKGROUND OF THE INVENTION

The invention relates to a switching amplifier having an input and an output, means being provided for inhibiting current flow in the output in such a way that the output is isolated from the input and assumes a high-impedance state. Such amplifiers may inter alia be used in sample-and hold circuits in order to isolate the input of, for example, a Miller integrator from a signal input. Such an amplifier used for this purpose is known from IBM Technical Disclosure Bulletin, Vol. 19, No. 11, April 1977, pages 4211–4212. This amplifier comprises a pnp-differential pair with signal take-off via an npn-current mirror. An isolating diode is arranged between the collector of the output transistor of this current mirror—which collector is connected to the output—and the collector of the associated pnp-transistor of the differential pair. In order to switch off the amplifier, the flow of current in the current mirror is inhibited by draining the collector currents of the transistors of the differential pair via two diodes. As a result of this, the current-mirror transistors are turned off and the diode is also turned off, so that no current flows in the output. The drawback of this amplifier is that the amplifier does not have a class-B output stage and that the output is connected to the collector of a transistor (the output transistor of the current mirror) and to the cathode of the diode, which cathode is equivalent to an emitter. The stray capacitances involved in the case of the collector have different, in particular, larger values than in the case of the diode so that the turn-off transient of the transistor is larger than the turn-off transient of the diode and, as a consequence, the two turn-off transients do not compensate for each other at the output.

If the switching amplifier is a class-B amplifier it is often necessary to equip this class-B amplifier with two output transistors of the same conductivity type in order to achieve a sufficiently high bandwith, because in most IC techniques, only transistors of one of the two conductivity types can be fabricated with satisfactory high-frequency properties. However, again this presents the problem that the output is connected both to the collector of a switched transistor and to the emitter of a switched transistor, which results in annoying switching transients at the output.

SUMMARY OF THE INVENTION

It is an object of the invention to provide a switching amplifier of the type set forth in the opening paragraph, which can have satisfactory high-frequency properties, which can produce a comparatively small amount of switching transients and which can have a class-B output. The invention is characterized in that the amplifier has an output stage comprising a first and a second transistor of a first conductivity type, whose main current paths are arranged in series between power-supply terminals, the emitter of the first transistor being connected to the collector of the second transistor and to the output, and said means comprises a first semiconductor junction which is arranged in the collector circuit of the second transistor between the collector of said second transistor and the output and which has a forward direction corresponding to the collector-current direction of the second transistor, and a switching device which, in response to a switching signal, changes the direct voltages on the base of the first transistor and on a point between said first semiconductor junction and the collector of the second transistor relative to the voltage on the output in such a way that the first transistor and the first semiconductor junction are turned off, the switching device being arranged to carry the collector current of the second transistor at least initially when the semiconductor junction is turned off, so that initially the second transistor can remain conductive.

As the first transistor and the semiconductor junction are turned off via the switching means while at least initially the second transistor need not be turned off, the first transistor and the semiconductor junction can give rise to capacitive switching transients of substantially equal magnitude, which largely compensate for each other on the output. It can be arranged that in the switched-on condition, the first and the second transistors together function as a class-B output stage with satisfactory high-frequency properties.

There are several alternative possibilities for the drive of the first and the second transistors in class-B operation. For example, the inventive principle may be applied to inter alia the class-B amplifier in accordance with U.S. Pat. No. 4,300,103.

With respect to the turn-off of the first semiconductor junction and the take-over of the collector current of the second transistor, the switching amplifier in accordance with the invention may further be characterized in that the switching device comprises a third transistor of the first conductivity type whose emitter electrode is connected to the point between said semiconductor junction and the collector of the second transistor, the voltage on the base of said third transistor being switched relative to the voltage on the output in response to the switching signal so as to turn off the first semiconductor junction, after which the third transistor carries the collector current of the second transistor.

In many output amplifiers comprising two output transistors of the same conductivity type, such as the output stage described in said U.S. patent, the first transistor is driven directly by the signal and the drive for the second transistor is derived from inter alia the base-emitter voltage of said first transistor. If the principle of the invention is used, the second transistor may then be driven to the maximum extent when current flow in the output ceases. In order to preclude this, the switching amplifier may further be characterized in that there are provided means for reducing the drive to the second transistor after the first semiconductor junction has been turned off.

In this respect, it is of advantageous if there is provided a feedback path between the collectors of the third transistor and the second transistor in order to apply negative feedback to the second transistor when the second semiconductor junction is in the cut-off state.

With respect to the feedback, the last-mentioned embodiment may further be characterized in that the feedback path comprises a fourth transistor of a second conductivity type opposite to the first conductivity type, which fourth transistor has its collector connected to the base of the second transistor, its emitter to a current source and to the collector of the third transistor, and its base to a point at reference voltage.

For an optimum combination of the switching means with the operation as a class-B output stage which may be required when the amplifier is switched-on, this embodiment may further be characterized in that the base of the first transistor is coupled to the base of the third transistor and a second semiconductor junction is arranged in the circuit between the base of the first transistor and the collector of the second transistor in series with the base-emitter junction of the third transistor, which second semiconductor junction is biassed with a constant direct current at least when the switching amplifier is in the non-switched-off state, in order to ensure that in this state, the voltage across the series arrangement of the base-emitter junction of the first transistor and the first semiconductor junction is maintained equal to two diode voltages so as to obtain class-B operation.

In this embodiment, it is advantageous if there are provided means for turning off the second semiconductor junction when the switching amplifier is switched off and, in the circuit between the base of the first transistor and the point between the first semiconductor junction and the collector of the second transistor, rendering a third semiconductor junction operative in series with the base-emitter junction of the third transistor, which third semi-conductor junction has a forward direction opposite to the forward direction of the base-emitter junction of the third transistor, so that in the switched-off state of the switching amplifier, a voltage of substantially zero volts appears between the base of said first transistor and said point between the first semiconductor junction and the collector of the second transistor.

With respect to the switching means, this embodiment may further be characterized in that the second semiconductor junction is arranged between the base of the third transistor and the base of the first transistor and the switching means comprise a fifth and a sixth transistor of the first conductivity type with a common emitter-current source, which fifth and sixth transistors have their collectors connected to a terminal via impedances, the base of the first transistor being connected to the collector of the fifth transistor and the base of the third transistor being connected to the collector of the sixth transistor, and means being provided for producing on said terminal a voltage which is substantially one diode voltage higher than the voltage on the output. This embodiment may further be characterized in that semiconductors are arranged in parallel with the impedances in the collector circuits of the fifth and the sixth transistor, the forward direction of said semiconductor junctions being the same as the forward direction of the fifth and the sixth transistor.

A special preferred embodiment of the switching amplifier in accordance with the invention is obtained when the output stage is an output stage as described in Applicant's U.S. patent application Ser. No. 256,364, filed Apr. 22, 1981, now U.S. Pat. No. 4,405,902, issued Sept. 20, 1983. The switching amplifier in accordance with the invention is then further characterized in that a high-frequency transmissive bypass coupling is arranged between the collector of the third transistor and the base of the second transistor.

Using a minimal extension of a known output stage, this yields a switching amplifier which meets the requirements. This preferred embodiment combines the basic idea of the invention with an optimum choice of an output stage.

DESCRIPTION OF THE DRAWINGS

The invention will now be described in more detail, by way of example, with reference to the drawings, in which:

FIG. 4 shows relevant portions of the circuit of FIG. 3 when the switching amplifier is turned on;

DESCRIPTION OF THE PREFERRED EMBODIMENT

Figure 1:
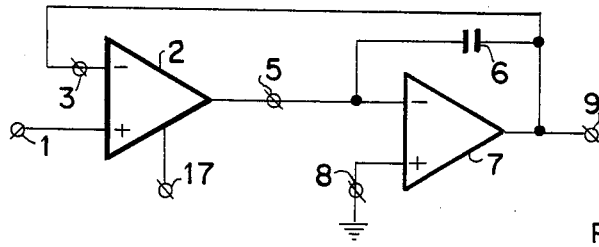
FIG. 1 shows a known sample-and-hold circuit in which the switching amplifier in accordance with the invention may be used.

FIG. 1 shows a sample-and-hold circuit as described in the afore-mentioned publication in IBM Technical Disclosure Bulletin, in which circuit the switching amplifier in accordance with the invention may be used. The sample-and-hold circuit has a signal input 1, which also forms a noninverting input of a switching amplifier 2 having an inverting input 3 and a switching input 17. The output 5 of the switching amplifier 2 is connected to the inverting input of an amplifier 7 which is arranged as a Miller integrator by means of a capacitor 6 and which has its non-inverting input 8 connected to a point of fixed potential, in the present case ground. The output 9 of the sample-and-hold circuit is connected to the output of the amplifier 7, which has a feedback path to the inverting input 3 of the switching amplifier.

As a result of the amplifier 7, point 5 is at a substantially constant potential, in the present case OV (virtual ground). Because of the negative-feedback path, the output 9 carries the signal on input 1—or an amplified or attenuated version of this signal when various resistors are included in known manner. Consequently, this signal on input 1 appears across capacitor 6. If, in response to a signal on input 17, amplifier 2 is turned off, the charge on capacitor 6 can no longer change and a sample of the input signal appears on output 9. Point 5 remains virtually at ground potential.

Figure 2:
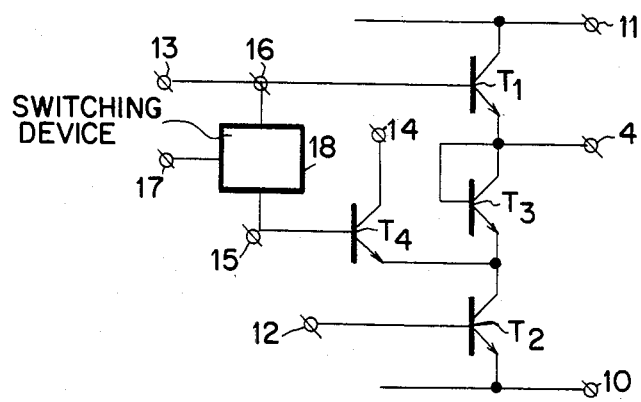
FIG. 2 is the circuit diagram of a switching amplifier in accordance with the invention.

FIG. 2 schematically represents the principle of one example of the switching amplifier 2 in accordance with the invention. In view of the bandwidth, an npn-npn output stage with transistors $T_1$ and $T_2$ has been selected, whose base electrodes receive a drive signal in a manner not shown. For the manner in which these transistors are driven on points 12 and 13, reference is made to inter alia said U.S. Pat. No. 4,300,103 and to said U.S. Pat. No. 4,405,902. The transistors $T_1$ and $T_2$ are arranged in series between power-supply terminals 10 and 11. The emitter of transistor $T_1$ is connected to the output 4, which, as is indicated by the dashed sign, is virtually at ground potential as a result of the following stage, and via a semiconductor junction $T_3$, it is also connected to the collector of transistor $T_2$. The collector of transistor $T_2$ is connected to the emitter of npn-transistor $T_4$, whose collector current is drained via point 14 in a manner not shown, for example directly to the positive power-supply terminal 11. The base of transistor $T_4$ is connected to an output 15 and the base of transistor $T_1$ is connected to an output 16 of a switching device 18 which has a switching input 17.

If by means of the switching device 18, the voltage on the base of transistor $T_4$ is increased relative to the virtual ground on output 4 and simultaneously, the voltage on the base of transistor $T_1$ is reduced relative to the virtual ground on output 4, diode $T_3$ and transistor $T_1$ are turned off. The stray capacitances which discharge during turn-off are base-emitter capacitances of equivalent capacitances in both cases, so that the discharge currents can compensate for each other on output 4 and no switching transient will arise. Transistor $T_2$ need not be turned off or need not be turned off simultaneously, for its collector current is transferred from diode $T_3$ to transistor $T_4$ and can be sustained. In order to minimize the dissipation, transistor $T_2$ may be turned off or may be set to a low quiescent-current level, for example under control of the switching device 18 or from the collector of transistor $T_4$.

Figure 3:
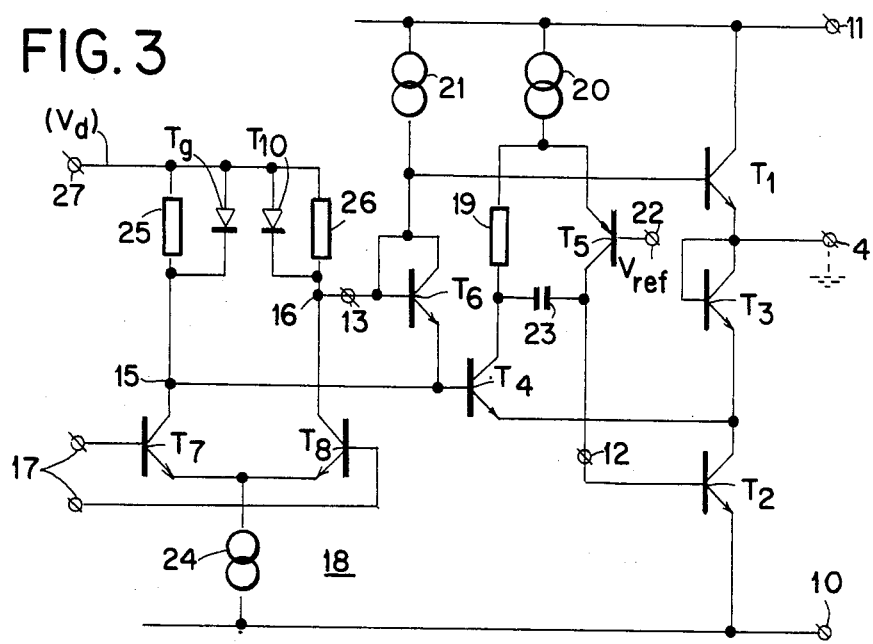
FIG. 3 shows a preferred embodiment of the invention.

FIG. 3 shows a preferred embodiment of the invention, which embodiment employs an output stage as described in the afore-mentioned U.S. Pat. No. 4,405,902. This output stage comprises output transistors $T_1$ and $T_2$ and a diode $T_3$ between the output 4 and the collector of transistor $T_2$. Transistor $T_4$ has its emitter connected to the collector of transistor $T_2$ and its base, via a diode $T_6$ to a signal input 13, the base of transistor $T_1$ and a current source 21. Via a resistor 19, the collector of transistor $T_4$ is connected to a current source 20 and the emitter of a pnp-transistor $T_5$, whose base is connected to a point 22 which is at a reference voltage $V_{ref}$ and whose collector is connected to the base of transistor $T_2$. A bypass capacitor 23 is arranged between the collector of transistor $T_4$ and the base of transistor $T_2$.

In this output stage the product of the collector currents of transistors $T_1$ and $T_2$ is maintained constant so that a class-B operation is obtained. The collector current of transistor $T_1$ is measured by means of its base-emitter voltage and the collector current of transistor $T_2$ is measured by means of the voltage across diode $T_3$. The voltage across the series arrangement of the diode $T_3$ and the base-emitter junction of transistor $T_1$ is therefore a measure of the product of the collector currents of transistors $T_1$ and $T_2$. By means of transistor $T_4$, the voltage across this series arrangement is compared with the substantially constant sum of the voltages across the diode $T_6$, which is biassed by the current source 21, and the base-emitter voltage of transistor $T_4$, which is biassed by the current source 20. The variation of the collector current of transistor $T_4$ is therefore a measure of the variation of the product of the collector currents of transistors $T_1$ and $T_2$, which variation is counteracted in that a point between the collector of transistor $T_4$ and the current source 20 is connected to the base of transistor $T_2$ via the emitter-collector path of pnp-transistor $T_5$, so that variations in the product of the collector currents of transistors $T_1$ and $T_2$ are fed back in a negative sense to the base of transistor $T_2$, capacitor 23 being a high-frequency by-pass across transistor $T_5$ and resistor 19 preventing transistor $T_5$ from short-circuiting capacitor 23 for high frequencies. As a result of the presence of the transistor $T_4$ and diode $T_3$, this output stage is eminently suitable for use as a switching amplifier in conformity with the principle shown in FIG. 2. For this purpose, the switching device 18 is arranged between the bases of transistors $T_4$ and $T_1$. The switching device 18 comprises two transistors $T_7$ and $T_8$ arranged as a differential pair and having a common emitter-current source 24. The collectors of these transistors are connected to an input 27 stage, not shown, in such a way that the d.c. level at this point is one diode voltage $V_d$ higher than the direct voltage on the output. However, it is to be noted that there are sample-and-hold circuits in which the sampling capacitor is arranged between an output and ground, so that output 4 does not carry a constant direct voltage but a varying signal voltage when the amplifier is switched on and the sampled signal values after the amplifier has been turned off. The follower action of the output stage ensures that the correct relationship between the voltage on the input 27 and the voltage on the output 4 is maintained when the amplifier is in the switched-on state. When the amplifier is in the turned-off state this relationship can be guaranteed if the voltage on input 27 tracks the voltage on output 4 (in this case with an offset of one diode voltage $V_d$), for example in a manner as described in U.S. Pat. No. 3,694,668, where the voltage on the input of a diode switch is made to track the voltage across a sampling capacitor.

The collectors of transistors $T_7$ and $T_8$ are connected to input 27, via resistors 25 and 26, respectively. The collector of transistor $T_8$ is also connected to the base of transistor $T_1$ and the collector of transistor $T_7$ is connected to the base of transistor $T_4$. Diodes $T_9$ and $T_{10}$ are arranged in parallel with the resistors 25 and 26.

Figure 4:
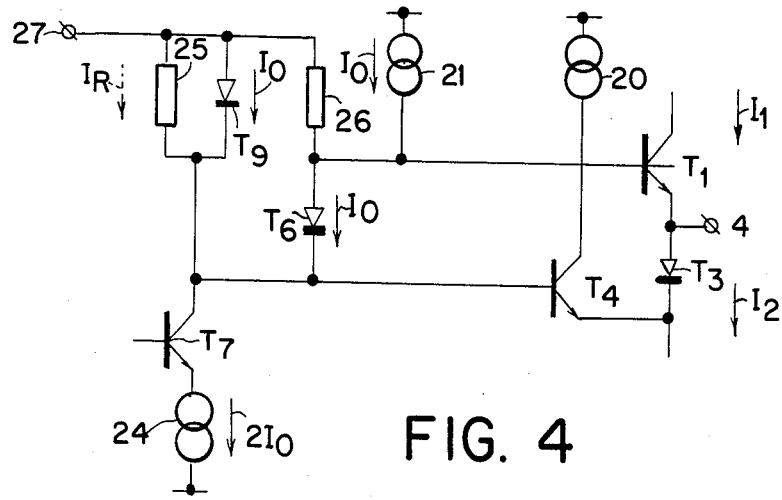

In order to explain the operation, two conditions will be considered:

The switching amplifier is turned on, i.e. a voltage is applied to input 17 such that transistor $T_7$ conducts and transistor $T_8$ is cut off. The conduction of transistor $T_7$ ensures that current from the current source 21 can be drained via diode $T_6$, so that the output stage comprising transistors $T_1$ and $T_2$ is correctly biassed. Since no current flows through resistor 26 input 13 will be at the same voltage $V_d$ as input 27. Consequently, the base of transistor $T_1$ is at a voltage equal to substantially one diode voltage relative to output 4 so that this transistor $T_1$ can conduct in dependence upon the signal on input 27. The base of transistor $T_4$ is connected to point 27 via diode $T_6$ and via diode $T_9$—which carries substantially a current determined by the difference between the currents from the current sources 21 and 24, so that the voltage across diode $T_9$ can be equal to that across diode $T_6$—and therefore is at a voltage of substantially zero volts relative to output 4. Therefore, one diode voltage may appear across diode $T_3$ so that diode $T_3$ can also conduct. The circuit then operates as a class-B output stage. This condition is represented in FIG. 4, which shows that part of the circuit of FIG. 3 which is relevant to the present explanation, the non-conductive transistor $T_8$ and the non-conductive diode $T_{10}$ not being shown. Assuming that no current flows in resistor 26, a current $I_o$ supplied by the source 21 will flow through the diode $T_6$. If source 24 supplies a current $2I_o$, the current through diode $T_9$ will also be $I_o$, and if diodes $T_9$ and $T_6$ are identical, the voltage across these diodes are also equal, so that the situation is in conformity with the assumption that (substantially) no current flows through the resistor 26. The voltage as a result of the current $I_o$ through diodes $T_6$ and $T_9$ appears between the base of transistor $T_1$ and the base of transistor $T_4$, which is biassed at a current which is assumed to be equal to $I_o$ by current source 20. The sum of the voltages across the junctions of $T_6$ and $T_4$, which are biassed by currents $I_o$, therefore appears between the base of transistor $T_1$ and the cathode of diode $T_3$, so that the emitter current $I_1$ of transistor $T_1$ and the current $I_2$ through diode $T_3$ comply with: $I_1 I_2 = C I_o^2$, where C is a constant.

The switching amplifier is turned off, for which purpose the switching voltage on switching input 17 is such that transistor $T_7$ is cut off and transistor $T_8$ conducts. The current from current source 21 then flows via transistor $T_8$ and no current flows in diode $T_6$ and diode $T_9$, while diode $T_{10}$ conducts. The voltage on the base of transistor $T_1$ is therefore one diode voltage lower than the voltage on input Vd, i.e. a voltage of substantially zero volts relative to output 4, so that transistor $T_1$ is cut off. The base of transistor $T_4$ is connected to input 27 via resistor 25, which carries no voltage because transistor $T_7$ is cut off and is therefore at a voltage equal to substantially one diode voltage, so that the emitter of transistor $T_4$ is at a voltage of substantially zero volts relative to output 4 and diode $T_3$ is consequently cut off. Therefore, no current flows in output 4. Transistor $T_2$ can remain conductive via transistor $T_4$, so that transistor $T_5$ also remains conductive. Since the current flow in diode $T_3$ ceases as a result of the negative feedback via transistors $T_4$ and $T_5$, the collector current of transistor $T_2$ would tend to keep the voltage across the series arrangement of diode $T_3$ and the base-emitter junction of transistor $T_1$ constant and equal to two diode voltages. But as the voltage across diode $T_6$ is reversed, the voltage across the series arrangement of diode $T_6$ and the base-emitter junction of transistor $T_4$ will also be substantially zero.

Figure 5:
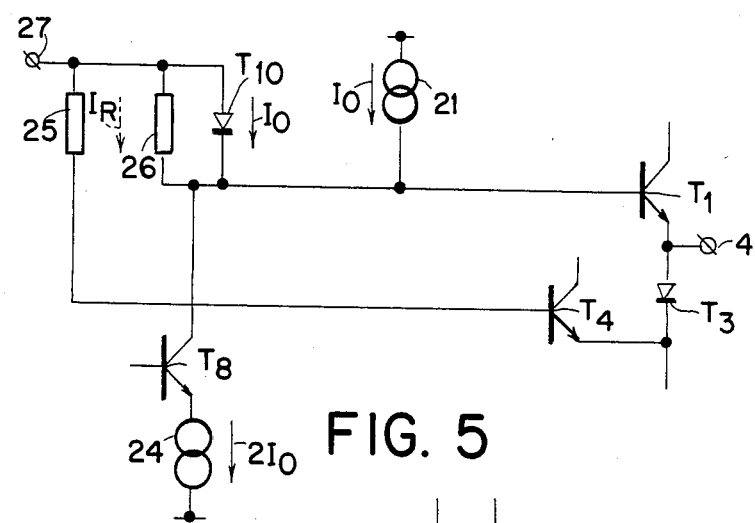
FIG. 5 shows relevant portions of the circuit of FIG. 5 when the switching amplifier is turned off.

This condition is illustrated by FIG. 5, in which diodes $T_9$ and $T_6$ and transistor $T_7$ are not shown because they do not conduct and in which all further parts which are not relevant are also not shown. The current $2I_o$ from the current source 24 is distributed between diode $T_{10}$ and the current source 21, so that a current $I_o$ flows through diode $T_{10}$. Apart from the voltage as a result of the base current of transistor $T_4$, no voltage drop is produced across the resistor 25, so that the base of transistor $T_4$ is at a potential which is one diode voltage higher than that on the base of transistor $T_1$ and the voltage between the base of transistor $T_1$ and the cathode of diode $T_3$ is zero volts.

Figure 6:
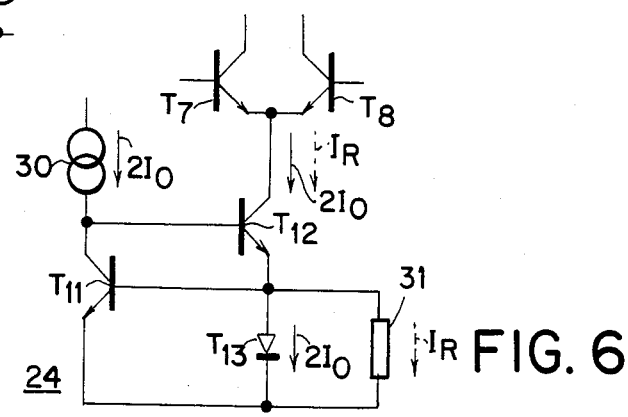
FIG. 6 shows a circuit diagram of a current source for use in the circuit of FIG. 3.

In FIG. 4 it has been assumed that no current flows in the resistor 25 in parallel with the conductive diode $T_9$. In reality, a current $I_R$ flows in this resistor 25, which current is equal to the voltage across diode $T_9$ divided by the resistance value of the resistor 25. This current $I_R$ disturbs the distribution of current between the diodes $T_9$ and $T_6$, so that a direct current will flow through the resistor 26. This may be precluded by selecting for the current source 24 a source which supplies a current $2I_o + I_R$, so as to provide compensation for the current $I_R$ through the resistor 25. For this purpose it is possible to use for example, the current source shown in FIG. 6, where the current $2I_o$ from a source is reflected to the emitters of transistors $T_7$ and $T_8$ by means of a current mirror comprising transistors $T_{11}$ and $T_{12}$ and a diode $T_{13}$. By connecting a resistor 31 in parallel with the diode $T_{13}$, the resistance of which resistor, relative to the diode $T_{13}$ which carries a current $2I_o$, that a current $I_R$ flows through it, the emitters of transistors $T_7$ and $T_8$ receive a current $2I_o + I_R$, thus compensating for the current $I_R$ through the resistor 25 (and the current through resistor 26 in the situation shown in FIG. 5).

What is claimed is:

1. A switching amplifier having an input and an output, and means for inhibiting current flow in the output in such a way that the output is isolated from the input and assumes a high-impedance state, characterized in that the amplifier includes an output stage comprising a first and a second transistor of a first conductivity type, whose main current paths are arranged in series between power-supply terminals, the emitter of the first transistor being connected to the collector of the second transistor and to the output, and the collector of the second transistor and the base of the first transistor being coupled to the input of the amplifier; and said inhibiting means comprises a first semi-conductor junction coupling the collector of said second transistor to the output and which has a forward direction corresponding to the collector-current direction of the second transistor, and a switching device coupled to the base of said first transistor and the collector of said second transistor which, in response to a switching signal, changes the direction voltages on the base of the first transistor and on a point between said first semiconductor and the collector of the second transistor relative to the voltage on the output in such a way that the first transistor and the first semiconductor junction are turned off, the switching device carrying the collector current of the second transistor at least initially when the semiconductor junction is turned off, so that initially the second transistor can remain conductive.

2. A switching amplifier as claimed in claim 1 characterized in that a high-frequency transmissive bypass coupling is arranged between the collector of the third transistor and the base of the second transistor.

3. A switching amplifier as claimed in claim 1, characterized in that the switching device comprises a third transistor of the first conductivity type whose emitter electrode is connected to the point between said first semi-conductor junction and the collector of the second transistor, the voltage on the base of said third transistor being switched relative to the voltage on the output in response to the switching signal so as to turn off the first semiconductor junction, after which the third transistor carries the collector current of the second transistor.

4. A switching amplifier as claimed in claim 3, characterized in that there are provided means for reducing the drive to the second transistor after the first semiconductor junction has been turned off.

5. A switching amplifier as claimed in claim 4, characterized in that there is provided a feedback path between the collectors of the third transistor and the second transistor in order to apply negative feedback to the second transistor when the first semiconductor junction is in the cut-off state.

6. A switching amplifier as claimed in claim 5, characterized in that the feedback path comprises a fourth transistor of a second conductivity type opposite to the first conductivity type, which fourth transistor has its collector connected to the base of the second transistor, its emitter to a current source and to the collector of the third transistor, and its base to a point at reference voltage.

7. A switching amplifier as claimed in claim 6, characterized in that the base of the first transistor is coupled to the base of the third transistor through a second semiconductor junction, which second semiconductor junction is biassed with a constant direct current at least when the switching amplifier is in the non-switched-off state, in order to ensure that in this state the voltage across the series arrangement of the base-emitter junction of the first transistor and the first semiconductor junction is maintained equal to two diode voltages so as to obtain class-B operation.

8. A switching amplifier as claimed in claim 7, characterized in that there are provided means for turning off the second semiconductor junction when the switching amplifier is switched off and, in the circuit between the base of the first transistor and the point between the first semiconductor junction and the collector of the second transistor, rendering a third semiconductor junction in series with the base-emitter junction of the third transistor, which third semiconductor junction has a forward direction opposite to the forward direction of the base-emitter junction of the third transistor, so that in the switched-off state of the switching amplifier, a voltage of substantially zero volts appears between the base of said first transistor and said point between the first semiconductor junction and the collector of the second transistor.

9. A switching amplifier as claimed in claim 7, characterized in that the second semiconductor junction is arranged between the base of the third transistor and the base of the first transistor and the switching means comprise a fifth and a sixth transistor of the first conductivity type with a common emitter-current source, which fifth and sixth transistors have their collectors connected to the input via impedances, the base of the first transistor being connected to the collector of the fifth transistor and the base of the third transistor being coupled to the collector of the sixth transistor, said input being provided with a voltage which is substantially one diode voltage higher than the voltage on the output.

10. A switching amplifier as claimed in claim 9, characterized in that semiconductor junctions are arranged in parallel with the impedances in the collector circuits of the fifth and the sixth transistor, the forward direction of said semiconductor junctions being the same as the forward direction of the fifth and sixth transistor.

11. A switching amplifier as claimed in claim 8, characterized in that the second semiconductor junction is arranged between the base of the third transistor and the base of the first transistor and the switching means comprise a fifth and a sixth transistor of the first conductivity type with a common emitter-current source, which fifth and sixth transistors have their collectors connected to a terminal via impedances, the base of the first transistor being connected to the collector of the fifth transistor and the base of the third transistor being connected to the collector of the sixth transistor, and means being provided for producing on said terminal a voltage which is substantially one diode voltage higher than the voltage on the output.

12. A switching amplifier as claimed in claim 11, characterized in that the semiconductor junctions are arranged in parallel with the impedances in the collector circuits of the fifth and the sixth transistor, the forward direction of said semiconductor junctions being the same as the forward direction of the fifth and sixth transistor.

* * * * *

UNITED STATES PATENT AND TRADEMARK OFFICE
CERTIFICATE OF CORRECTION

PATENT NO. : 4,549,145
DATED : October 22, 1985
INVENTOR(S) : Rudy J. Van De Plassche It is certified that error appears in the above-identified patent and that said Letters Patent is hereby corrected as shown below:

Claim 2, line 1, change "1" to read -- 3 --.

Signed and Sealed this

Twelfth Day of August 1986

[SEAL]

Attest:

DONALD J. QUIGG

Attesting Officer

Commissioner of Patents and Trademarks